United States Patent
Shinriki et al.

(10) Patent No.: US 7,105,101 B2
(45) Date of Patent: Sep. 12, 2006

(54) METHOD OF REMOVING OXIDE FILM ON A SUBSTRATE WITH HYDROGEN AND FLUORINE RADICALS

(75) Inventors: Hiroshi Shinriki, Matsudo (JP); Shintaro Aoyama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 3 days.

(21) Appl. No.: 10/678,045

(22) Filed: Oct. 3, 2003

(65) Prior Publication Data

US 2004/0251235 A1 Dec. 16, 2004

(30) Foreign Application Priority Data

Oct. 3, 2002 (JP) ............... 2002-291579

(51) Int. Cl.
*B44C 1/22* (2006.01)
(52) U.S. Cl. ............... 216/67; 438/710; 438/720; 438/722
(58) Field of Classification Search ............... 427/569, 427/595; 216/58, 67; 438/706, 710, 720, 438/722
See application file for complete search history.

(56) References Cited

U.S. PATENT DOCUMENTS

| | | | | |
|---|---|---|---|---|
| 4,749,440 A | * | 6/1988 | Blackwood et al. | 438/706 |
| 5,007,971 A | * | 4/1991 | Kanai et al. | 136/258 |
| 5,326,406 A | * | 7/1994 | Kaneko et al. | 134/1 |
| 5,629,246 A | * | 5/1997 | Iyer | 438/763 |
| 5,656,402 A | * | 8/1997 | Kasuga | 430/22 |
| 6,100,496 A | * | 8/2000 | Takuya et al. | 219/121.59 |
| 6,494,986 B1 | * | 12/2002 | Hanawa et al. | 156/345.35 |
| 6,688,020 B1 | * | 2/2004 | Toshima et al. | 34/573 |
| 6,939,434 B1 | * | 9/2005 | Collins et al. | 156/345.35 |
| 2004/0166694 A1 | * | 8/2004 | Won et al. | 438/787 |

FOREIGN PATENT DOCUMENTS

| | | |
|---|---|---|
| JP | 03-116727 | 5/1991 |
| JP | 04-294539 | 10/1992 |
| JP | 05-160085 | 6/1993 |
| JP | 05-226315 | 9/1993 |
| JP | 06-338478 | 12/1994 |
| JP | 07-321046 | 12/1995 |
| JP | 2001-232317 | 8/2001 |
| JP | 2002-219429 | 8/2002 |

\* cited by examiner

*Primary Examiner*—Bret Chen
(74) *Attorney, Agent, or Firm*—Crowell & Moring LLP

(57) ABSTRACT

A dry cleaning process for removing native oxide at improved efficiency is disclosed. The dry cleaning process minimizes the amount of fluorine atoms absorbed on the surface of a processed substrate. Fluorine radicals are provided to the substrate together with hydrogen radicals. The substrate is processed by the reaction of the fluorine radicals and the hydrogen radicals.

8 Claims, 8 Drawing Sheets

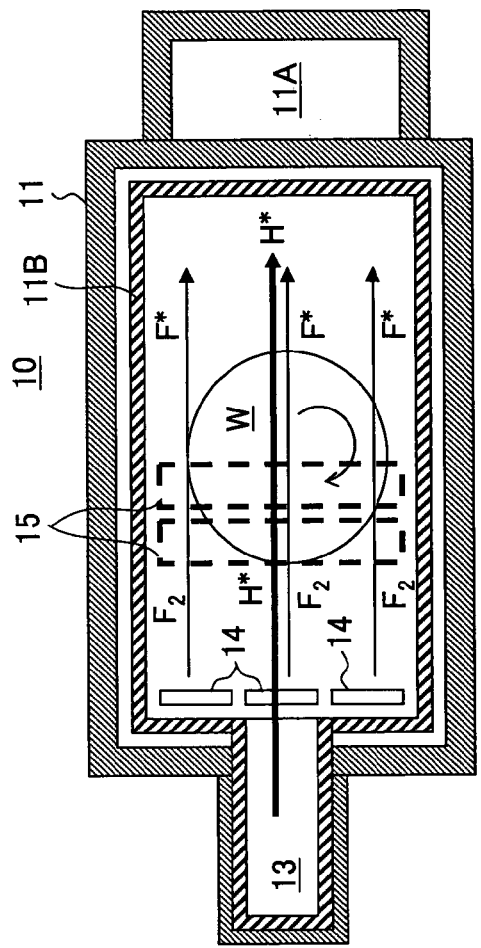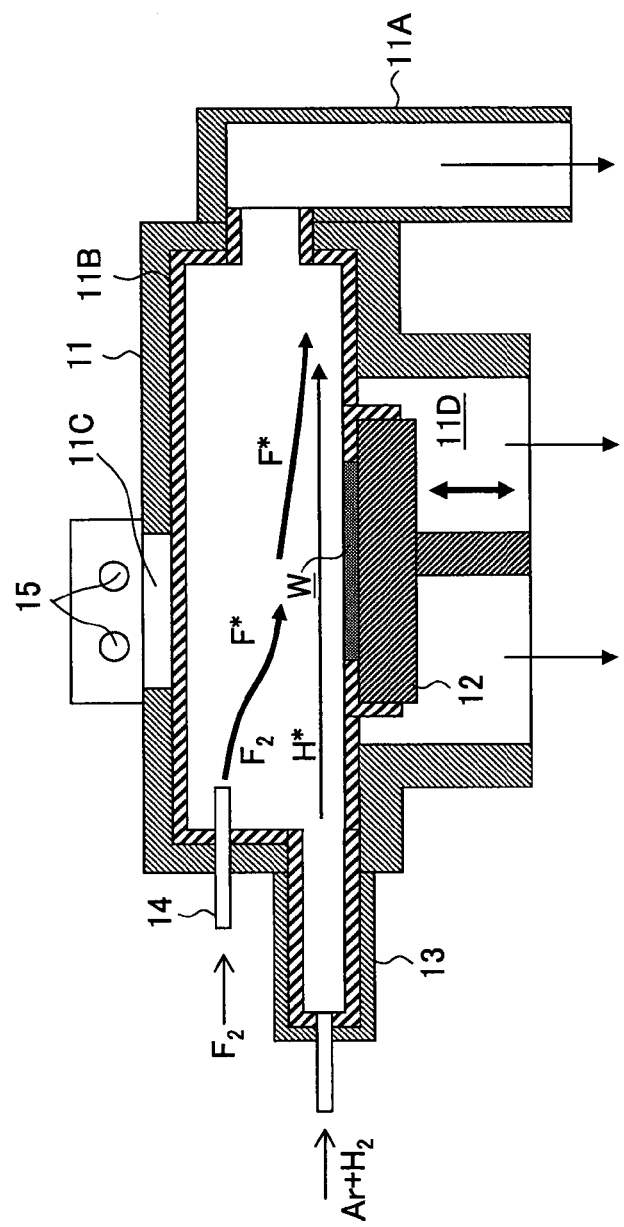
FIG.3A
FIG.3B

METHOD OF REMOVING OXIDE FILM ON A SUBSTRATE WITH HYDROGEN AND FLUORINE RADICALS

BACKGROUND OF THE INVENTION

1. Field of the Invention

The present invention generally relates to the fabrication of a semiconductor device, and particularly, to a so-called pre-cleaning process for removing native oxide formed on the surface of a silicon substrate.

2. Description of the Related Art

Native oxide formed on the surface of a silicon substrate needs to be removed before various processes such as an insulation film forming process and an epitaxial process on the silicon substrate. The native oxide includes, for example, an oxide film formed due to the atmospheric oxidation of hydrophobic silicon surface formed by cleaning the silicon surface with diluted fluorine acid and an oxide film unintentionally formed in oxidation processing, dilution processing, and CVD processing, for example, even at a low temperature.

The native oxide needs to be completely removed in the recent fabrication of super fine semiconductor devices in which, for example, a high dielectric gate insulation film, which is 1 nm thick or less, needs to be formed. The native oxide also needs to be removed not only for forming a super thin insulation film such as the high dielectric gate insulation film but also for forming a silicon/metal contact and metal silicide.

The native oxide is removed from the surface of a silicon substrate in dry atmosphere so that the silicon substrate the native oxide of which is removed is transported in vacuum to the next step with its cleaned surface kept as clean as it is. Thus, the removal of the native oxide is referred to as dry cleaning.

For example, the following methods for dry cleaning processing are known: a method of processing the surface of the silicon substrate in anhydrous HF gas, a method of processing the surface of the silicon substrate in an atmosphere of HF gas and water vapor, and a method of processing the surface of the silicon substrate in an atmosphere of $F_2$ gas excited by ultra violet ray thereby to generate fluorine radicals with additional $H_2$ gas.

Japanese Laid-open Patent Application No. 7-321046 is known as a prior art literature related to the present invention.

The method of processing the surface of the silicon substrate with anhydrous HF gas is a method in which the native oxide is removed by reacting remnant moisture contained on the surface of the native oxide or in the native oxide with the anhydrous HF gas thereby to form HF aqueous solution. The native oxide can be selectively removed by controlling the density of HF.

The method of processing the surface of the silicon substrate in an atmosphere of HF gas and water vapor is a method in which HF gas and $H_2O$ gas condense on the native oxide into HF aqueous solution thereby to etch the native oxide. When the etching of the native oxide is completed, the supply of the HF gas and the water vapor is terminated. The liquid condensed on the silicon substrate evaporates.

One of the problems of the conventional methods is that a large amount of fluorine (F) atoms remain on the surface of the processed silicon substrate after processing, and residual substance is easily left after the liquid evaporates. Another problem of the conventional methods is caused by organic substance absorbed on the surface of the silicon substrate that is difficult to remove before the removal of native oxide. The organic substance may cause the residual substance.

In the case of the method of processing a substrate surface with fluorine radicals generated by exciting an atmosphere of $F_2$ gas and hydrogen gas with ultra violet light, the problem that residual substance remains on the substrate surface after processing does not occur. However, a large amount of fluorine (F) atoms are absorbed on the surface of the silicon substrate. The fluorine atoms need to be removed after processing for removing native oxide.

SUMMARY OF THE INVENTION

Accordingly, it is a general object of the present invention to provide a novel and useful method of and an apparatus for processing a substrate in which at least one of the problems are eliminated.

Another and more specific object of the present invention is to provide a method of and an apparatus for removing native oxide in which no residual substance is left and the amount of absorbed fluorine is minimized.

At least one of the above objects is achieved by the following:

as described in claim 1, a method of processing a substrate, comprising the steps of:

providing hydrogen radicals to a surface of the substrate, providing fluorine radicals to the surface of the substrate, and processing the surface of the substrate with the hydrogen radicals and the fluorine radicals;

as described in claim 2, the method as claimed in claim 1, wherein the hydrogen radicals are generated in a step of exciting hydrogen gas with high frequency plasma;

as described in claim 3, the method as claimed in claim 2, wherein the hydrogen radicals are generated outside a processing space in which the substrate is retained, and are transported to the processing space;

as described in claim 4, the method as claimed in claim 1, wherein the fluorine radicals are generated in a step of exciting fluorine gas with ultra violet rays;

as described in claim 5, the method as claimed in claim 4, wherein the fluorine radicals are generated in a processing space in which the substrate is retained;

as described in claim 6, the method as claimed in claim 1, wherein the step of providing the hydrogen radicals and the step of providing the fluorine radicals are performed simultaneously;

as described in claim 7, the method as claimed in claim 6, wherein the step of providing the fluorine radicals is begun after the step of providing the hydrogen radicals is begun;

as described in claim 8, the method as claimed in claim 7, wherein the step of providing the hydrogen radicals is terminated after the step of providing the fluorine radicals is terminated;

as described in claim 9, the method as claimed in claim 1, further comprising the step of providing water vapor to the surface of the substrate;

as described in claim 10, the method as claimed in claim 1, further comprising the step of:

providing water vapor to the surface of the substrate, wherein the step of providing the hydrogen radicals and the step of providing the fluorine radicals are performed simultaneously, and the step of providing hydrogen radicals and fluorine radicals and the step of providing water vapor are alternatively and repeatedly performed;

as described in claim 11, the method as claimed in claim 10, wherein the processing space in which the substrate is retained is purged with inert gas after the step of providing water vapor and before the step of providing hydrogen radicals and fluorine radicals;

as described in claim 12, an apparatus for processing a substrate, comprising:

a processing vessel that is vacuated at a first end, said processing vessel provided with a mount on which the substrate is retained, a remote plasma source provided at a second end of said processing vessel, a processing gas port provided at the second end of said processing vessel, a ultra violet light source formed between said processing gas port and the substrate, said ultra violet light source provided on said processing vessel, a hydrogen providing line connected to said remote plasma source, and a fluorine providing line connected to said processing gas port;

as described in claim 13, the apparatus as claimed in claim 12, wherein the mount has a mechanism for rotating the substrate; or as described in claim 14, the apparatus as claimed in claim 12, wherein a water vapor providing line is provided to the second end of said processing vessel.

Other objects, features, and advantages of the present invention will become more apparent from the following detailed description when read in conjunction with the accompanying drawings.

BRIEF DESCRIPTION OF THE DRAWINGS

FIGS. 3A and 3B are schematic diagrams showing the structure of an apparatus for processing a substrate according to a first embodiment of the present invention;

DETAILED DESCRIPTION OF THE PREFERRED EMBODIMENTS

Operation

According to the present invention, HF radicals (HF*) are generated from fluorine radicals (F*) and hydrogen radicals (H*) provided to the surface of the substrate in the following reaction:

$$F^* + H^* \rightarrow HF^*. \qquad (1)$$

$SiO_2$ film on the surface of a silicon substrate is removed by the generated HF radicals (HF*) in the following reaction:

$$SiO_2 + 4HF \rightarrow SiF_4 + 2H_2O_2. \qquad (2)$$

According to the above conventional method in which fluorine radicals and hydrogen gas are used, the oxide formed on the surface of the silicon substrate is removed in the following reactions:

$$2F^* + H_2 \rightarrow 2HF^*, \text{ and} \qquad (3)$$

$$SiO_2 + 4HF \rightarrow SiF_4 + 2H_2O_2. \qquad (4)$$

The comparison between the above reactions reveals that the process according to the present invention is much efficient in the generation of HF radicals than the conventional process. Accordingly, the native oxide is efficiently removable by the dry process according to the present invention.

Since hydrogen radical H* is involved in the reaction for removing native oxide, the exposed clean surface of the silicon substrate is terminated with hydrogen. The absorption of fluorine is efficiently inhibited.

According to the present invention, the reaction for removing $SiO_2$ film is further promotable by adding water vapor ($H_2O$) as catalyst.

Figure 1:
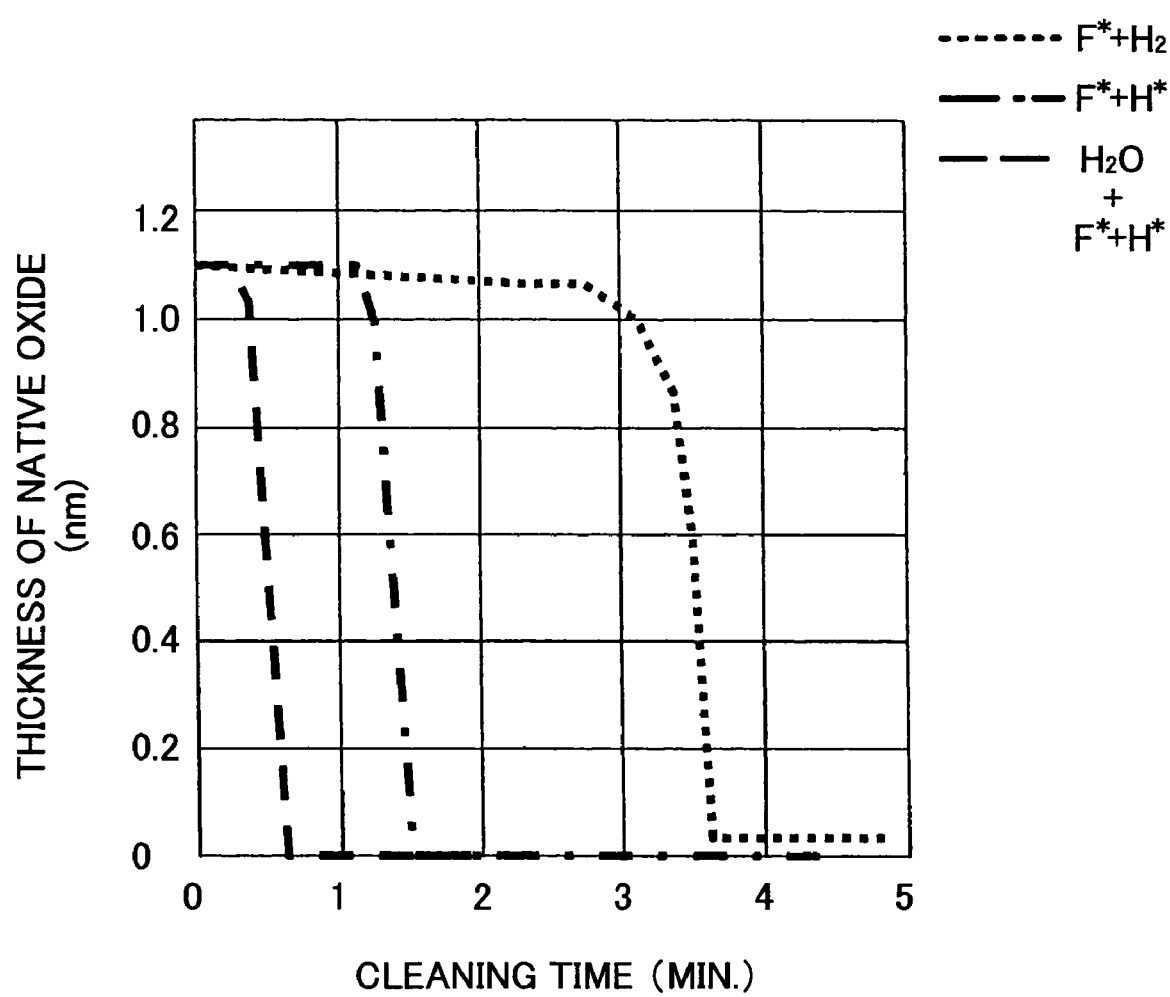
FIG. 1 is a graph for explaining the principle of the present invention.

FIG. 1 is a graph showing the thickness of native oxide as a function of cleaning time in the case in which 1.1 nm thick native oxide is removed in the process according to the present invention. In FIG. 1, a dotted line denotes the case in which HF radicals HF* are generated in the above reaction (3). An alternate long and short dash line denotes the case in which HF radicals HF* are generated in the above reaction (1), and a broken line denotes the case in which $H_2O$ is used as catalyst in the above reaction (1).

It is apparent from FIG. 1 that the conventional reaction for removing native oxide takes about 3.5 minutes, but the reaction for removing native oxide according to the present invention takes only about 1.5 minutes. It is also apparent from FIG. 1 that, if $H_2O$ is used as catalyst, the time required for the process is reduced up to about 0.7 minutes. According to the present invention, if $H_2O$ is provided to the surface of the silicon substrate in advance, and $H_2O$ molecules are absorbed by the surface of the silicon substrate, it is possible to further reduce incubation time for removing native oxide, and consequently, processing time.

Figure 2:
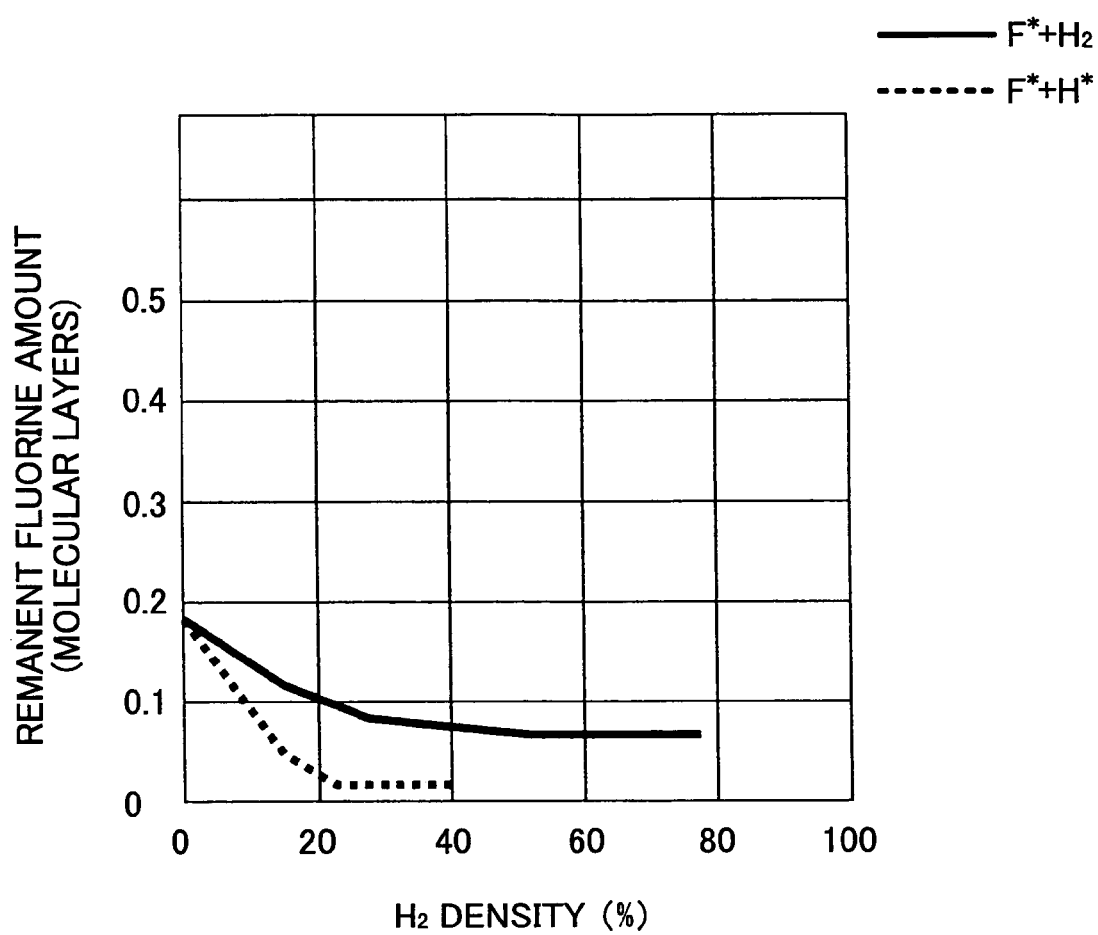
FIG. 2 is another graph for explaining the principle of the present invention.

FIG. 2 is a graph showing the density of remnant fluorine atoms on the silicon substrate surface as a function of the density of hydrogen gas in the case of the process for removing native oxide according to the present invention. In FIG. 2, the vertical axis of the graph indicates the density of remnant fluorine atoms converted into the number of molecular layers, and the horizontal axis of the graph indicates the volume percentage of hydrogen gas in an processing atmosphere. In FIG. 2, a dotted line indicates the result of the present invention, and a solid line indicates the result of the conventional method in which hydrogen gas is added to fluorine radicals.

Referring to FIG. 2, as the density of hydrogen gas in the processing atmosphere is increased, the density of remnant fluorine on the substrate surface is generally reduced. FIG. 2 shows that the method of processing a substrate according to the present invention can reduce the density of remnant fluorine more than the conventional method does.

An apparatus for processing a substrate needs to simultaneously generate fluorine radicals and hydrogen radicals in order to realize the above reaction (1).

FIRST EMBODIMENT

FIGS. 3A and 3B are a top view and a sectional view, respectively, showing an apparatus 10 for processing a substrate according to a first embodiment of the present invention.

Referring to FIGS. 3A and 3B, the apparatus 10 for processing a substrate has a processing vessel 11 that is provided with a vacuation port 11A at an end thereof. A mount 12 that retains a substrate W that is to be processed is provided in the processing vessel 11.

An inner processing vessel 11B made of quartz glass is formed inside the processing vessel 11. A remote plasma source 13 is provided at another end of the processing vessel 11.

Hydrogen gas is provided to the remote plasma source 13 together with inert gas such as argon Ar. Hydrogen radicals H* are generated by exciting the hydrogen gas at a high frequency of 400 kHz, for example. The generated hydrogen radicals H* flow in the quartz processing vessel 11B along the surface of the substrate W on the mount 12 to the vacuation port.

The apparatus 10 is provided with a process gas port 14 for introducing $F_2$ gas at a side of the processing vessel 11 at which the remote plasma source 13 is provided. The fluorine $F_2$ gas introduced through the processing gas port 14 flows in the quartz processing vessel 11B along the surface of the substrate W on the mount 12.

A quartz aperture 11C is formed on the processing vessel 11 at a position slightly approaching from the substrate W to the processing gas port 14. A ultra violet light source 15 such as an excimer lamp and a low pressure mercury lamp that radiates light of preferably 308 nm or 254 nm wavelength is provided on the processing vessel 11 at a position corresponding to the quartz aperture 11C.

As indicated by an arrow in FIG. 3B, the mount 12 of the apparatus 10 can move up and down between a position shown in FIG. 3B at which the substrate W is processed and a position (not shown) at which the substrate W' is loaded and unloaded. The space 11D under the processing vessel 11 in which the mount 12 moves up and down is vacuated with differential pumping independently from the vacuation port 11A.

Figure 4A:
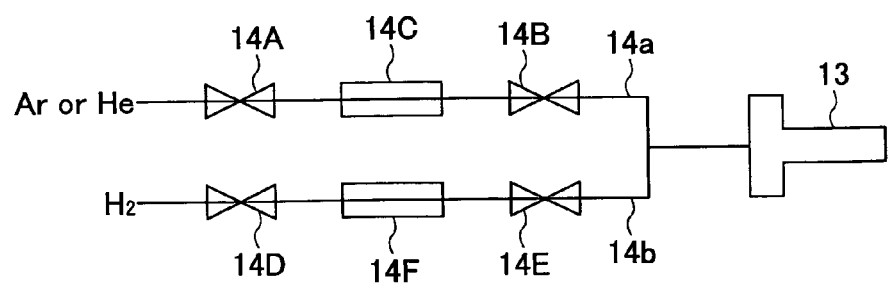
FIGS. 4A and 4B are schematic diagrams showing gas providing systems used for the apparatus for processing a substrate shown in FIGS. 3A and 3B.
Figure 4B:
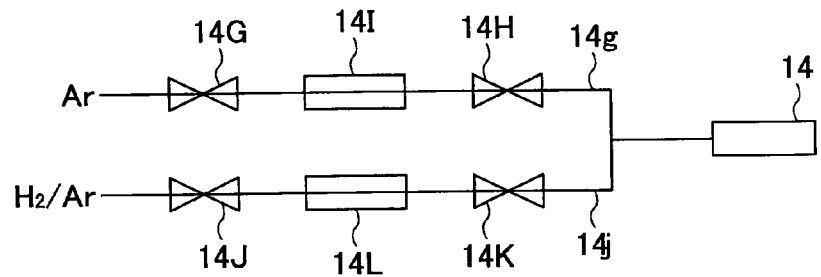

FIGS. 4A and 4B are schematic diagrams showing gas providing systems connected to the remote plasma source 13 and the processing gas port 14, respectively.

Referring to FIG. 4A, rare gas such as argon Ar and helium He is provided to the remote plasma source 14 as plasma gas via a line 14b in which valves 14A and 14B and mass flow controller 14C are provided. Hydrogen gas is added to the rare gas via a line 14d in which valves 14D and 14E and a mass flow controller 14F are provided.

On the other hand, Ar purge gas is provided to the process gas port 14 via a line 14g in which valves 14G and 14H and a mass flow controller 14I. Fluorine $F_2$ gas diluted by argon Ar carrier gas is provided via a line 14j in which valves 14J and 14K and a mass flow controller 14L are provided.

Referring to FIGS. 3A and 3B again, the fluorine gas introduced to the quartz processing vessel 11B via the processing gas port 14 is excited by the 308 nm ultra violet light from the ultra violet light source 15. The excitation generates fluorine radicals F*. On the other hand, hydrogen radicals H* are introduced from the remote plasma source 13 to the quartz processing vessel 11B. The fluorine radicals F* and the hydrogen radicals H* flow in the processing vessel 11B along the surface of the substrate W, and removes native oxide formed on the surface of the substrate W in the above reactions (1) and (2).

Figure 5:
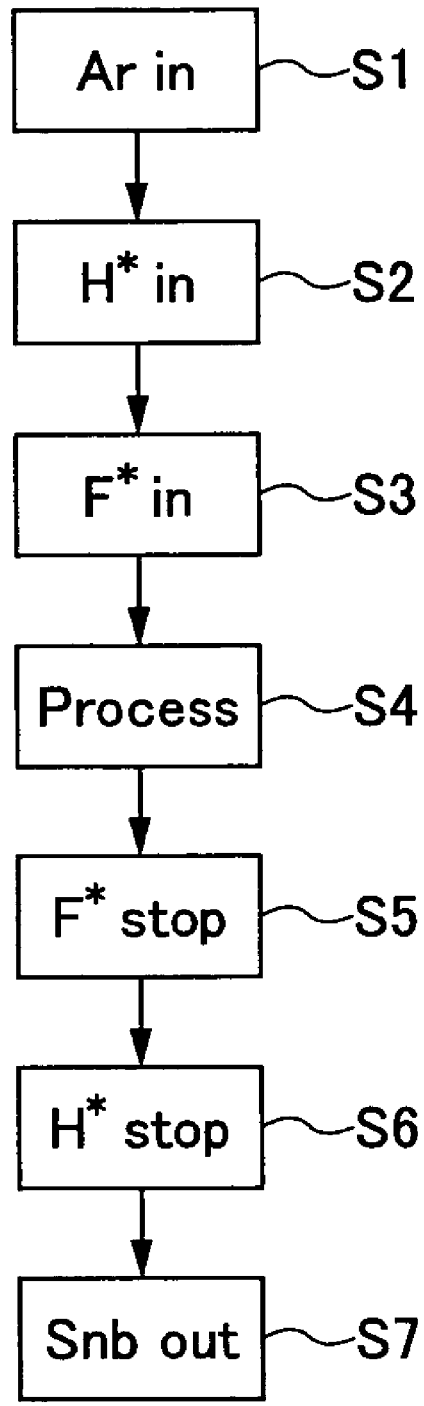
FIG. 5 is a flow chart showing steps for processing a substrate according to the first embodiment of the present invention.

FIG. 5 is a flow chart showing the process of removing native oxide according the first embodiment performed by the apparatus shown in FIGS. 3A and 3B.

Referring to FIG. 5, in step S1, Ar gas is introduced to the processing vessel 11B via the line 14a, for example. The pressure in the processing vessel 11B is set at 133 Pa (1 Torr). The temperature of the substrate W is stabilized at 300° C. by a heater built in the mount 12 for retaining the substrate W. This step is completed in about 60 seconds.

In step S2, the pressure in the processing vessel 11B is set in a range of 13.3 Pa–4 kPa (0.1–300 Torr) so that plasma is generated in the remote plasma source 13. Ar gas is provided at a flow of 1000–500 SCCM via the line 14a to the remote plasma source 13, and hydrogen gas is provided at a flow of 100 SCCM via the line 14b to the remote plasma source 13. While the Ar gas and the hydrogen gas is provided, a 1 kW, 400 kHz electric power is provided to the remote plasma source 13 thereby to generate hydrogen radicals H*. In step S2, the generated hydrogen radicals H* are introduced into the processing vessel 11B for about 1 minute.

In step S3, the valves 14J and 14K are operated, and fluorine gas diluted by Ar carrier gas to a density of 20% is introduced into the processing vessel 11B at a flow of 100 SCCM via the line 14j, the mass flow controller 14L, and the processing gas port 14. In step S3, the excimer lump 15 is operated thereby to excite the introduced fluorine gas and generate fluorine radicals F*.

In step S4, native oxide on the surface of the substrate W is removed by the hydrogen radicals H* and the fluorine radicals F*. The time required for completing step S4 depends on the kind and the thickness of the native oxide. If about 1 nm thick native oxide formed by the ordinary wet cleaning of a substrate is to be removed, step S4 may be completed in about 1 minute.

In step S5, the introduction of fluorine gas is terminated. The hydrogen radicals from the remote plasma source 13 are continuously provided into the processing vessel 11B for a couple of minutes. This step minimizes the absorption of fluorine on the surface of the substrate W.

In step S6, the operation of the remote plasma source 13 is terminated. In step S7, the substrate W is moved from the processing vessel 11 to a vacuum transportation path (not shown) connected to the processing vessel 11, for example, by a substrate transportation mechanism.

As described above with reference to FIG. 1, according to the present invention, native oxide is removed by fluorine radicals F* and hydrogen radicals H*. The process according to the present invention can efficiently remove native oxide in a shorter time period than a time period in which the conventional process that uses fluorine radicals F* and hydrogen gas removes the native oxide.

As described above with reference to FIG. 2, according to the present invention, since hydrogen radicals H* terminates the cleaned silicon substrate surface, the amount of fluorine atoms that is absorbed on the substrate surface is reduced. This reduction makes a process for removing fluorine after the process for removing native oxide unnecessary.

SECOND EMBODIMENT

Figure 6:
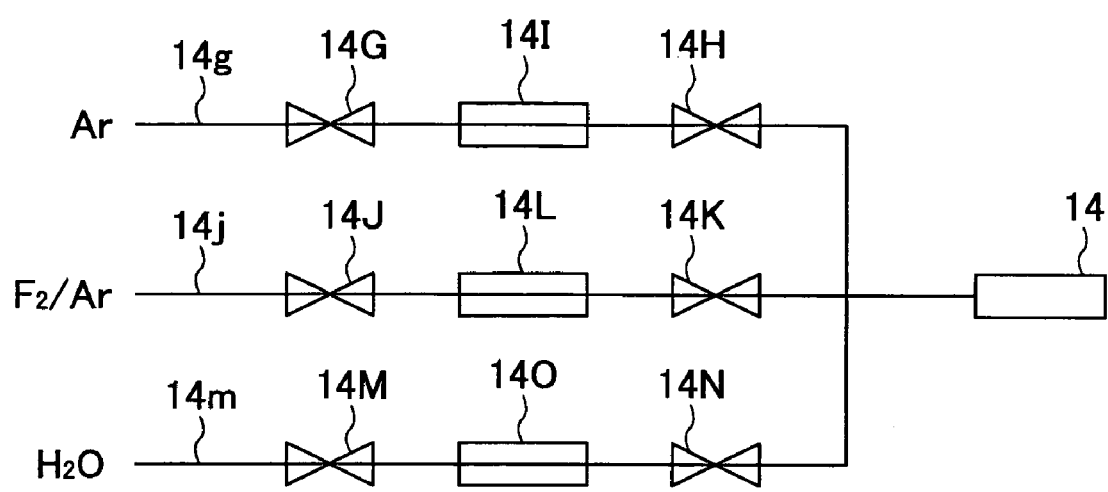
FIG. 6 is a schematic diagram showing a gas providing system used for an apparatus for processing a substrate according to a second embodiment of the present invention.

FIG. 6 is a schematic diagram showing a gas providing system used for an apparatus for processing a substrate according to a second embodiment of the present invention. The apparatus for processing a substrate according to this embodiment is substantially identical to the apparatus 10 for processing a substrate described above, and its description is omitted. In FIG. 6, elements that have been described above are referred to by the same reference numerals, and their description is omitted.

Referring to FIG. 6, according to this embodiment, a line 14m for providing water vapor (H₂O) including valves 14M and 14N and a mass flow controller 140 is added to the gas providing system connected to the processing gas port 14.

When native oxide is removed by hydrogen radicals H* and fluorine radicals F*, water vapor is provided to the processing vessel 11 as catalyst via the line 14m of the gas providing system shown in FIG. 6. The water vapor promotes the process of removing native oxide as described above with reference to FIG. 1.

THIRD EMBODIMENT

Figure 7:
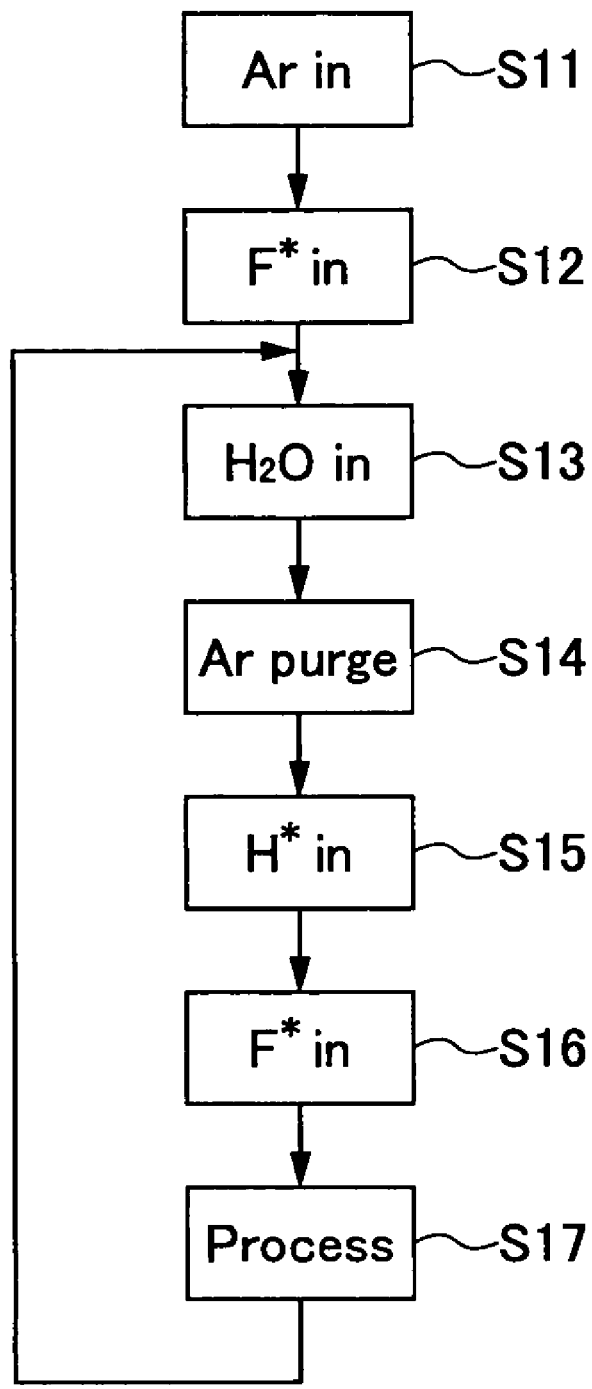
FIG. 7 is a flow chart showing steps for processing a substrate according to a third embodiment of the present invention.

FIG. 7 is a flow chart showing a process for removing native oxide according to a third embodiment of the present invention that is performed by the apparatus 10 for processing a substrate shown in FIG. 3 and the gas providing system shown in FIG. 6.

Referring to FIG. 7, in step S11, Ar gas is introduced into the quartz processing vessel 11B via the line 14a, for example. Pressure in the quartz processing vessel 11B is maintained at 133 Pa, and temperature of the substrate W is maintained at 300° C.

In step S12, pressure in the processing vessel 11B is set in a range of 13.3 Pa–about 4 kPa thereby to generate plasma in the remote plasma source 13. Ar gas and hydrogen gas are provided to the remote plasma source 13 via the line 14a and the line 14b, respectively. The flow of Ar gas is maintained at 500 SCCM through 1000 SCCM, and the flow of hydrogen gas is maintained at 100 SCCM. A 1 kW, 400 kHz electric power is provided to the remote plasma source 13 thereby to generate hydrogen radicals H*. The surface of the substrate W is processed by the generated hydrogen radicals H* for about 1 minute.

In step S13, fluorine gas diluted with Ar carrier gas to a density of 20% is provided to the processing vessel 11B via the line 14j at a flow of about 100 SCCM. The fluorine gas is excited with ultra violet light radiated by the excimer lump 15 thereby to generate fluorine radicals F*.

In step S14, Ar purge gas is provided into the processing vessel 11B via the line 14g. The Ar purge gas removes moisture in the processing vessel 11B besides moisture absorbed on the surface of the substrate W.

In step S15, hydrogen radicals H* are provided into the processing vessel 11B in the same manner as the above embodiments. Further, in step S16, fluorine radicals F* are provided into the processing vessel 11B. In step S17, native oxide on the surface of the substrate W is removed in the above reactions (1) and (2).

Figure 8:
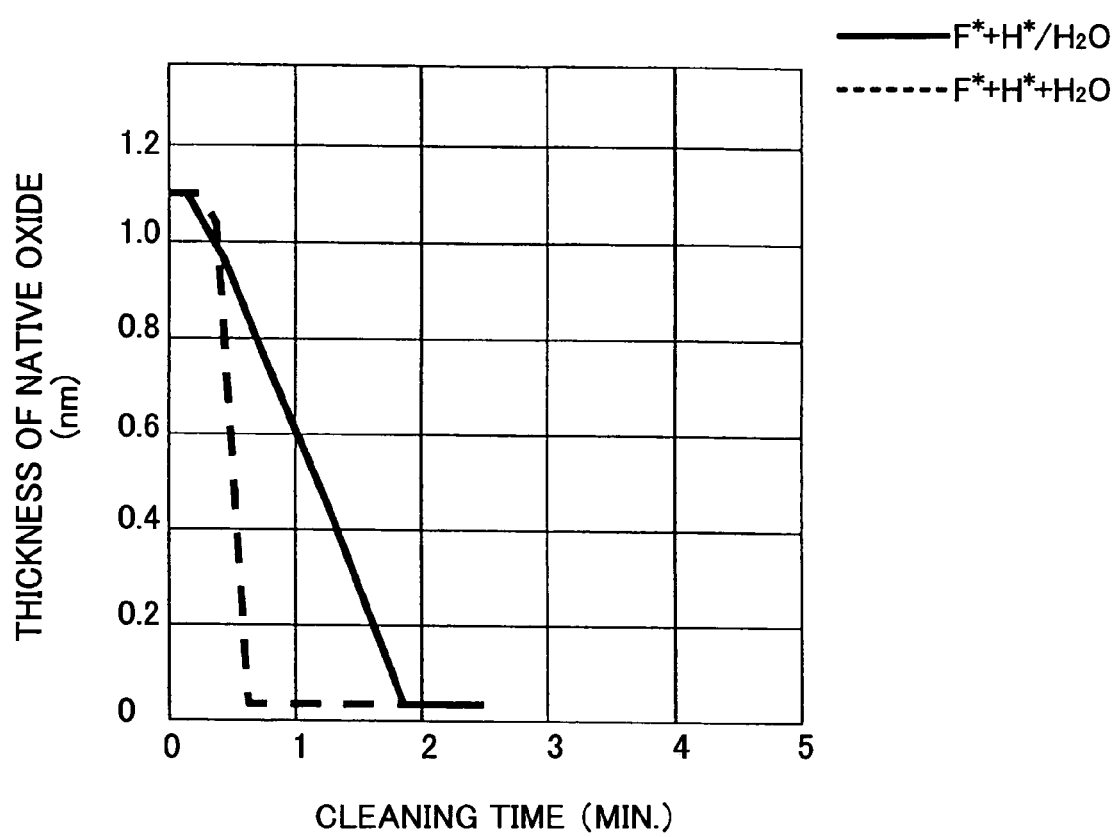
FIG. 8 is a graph showing an effect of the third embodiment.

FIG. 8 is a graph showing the relationship between the thickness of native oxide and cleaning time with respect to the process for removing native oxide according to this embodiment shown in the flow chart of FIG. 7. The case of the process for removing native oxide according to the above embodiment is also shown in FIG. 8 for comparison. In FIG. 8, a solid line indicates the result of this embodiment, and a broken line indicates the result of the aforementioned embodiment.

Referring to FIG. 8, it is noted that native oxide is very quickly removed in a short time period in the aforementioned embodiment in which hydrogen radical H*, fluorine radicals F*, and water vapor H₂O are simultaneously provided.

In contrast, since only H₂O absorbed on the substrate surface is used as catalyst in the process for removing native oxide according to this embodiment, the speed of the removal of native oxide is reduced. The thickness of native oxide decreases substantially linearly as time passes.

In the process for removing native oxide according to this embodiment, processing speed is controllable if necessary.

According to the present invention, native oxide formed on the surface of a substrate is efficiently removable by an entirely dry process using fluorine radicals and hydrogen radicals. Additionally, the amount of fluorine absorbed on the substrate surface is minimized.

The present invention is not limited to these embodiments, but various variations and modifications may be made without departing from the scope of the present invention.

This patent application is based on Japanese Priority Patent Application No. 2002-291579 filed on Oct. 3, 2003, the entire contents of which are hereby incorporated by reference.

What is claimed is:

1. A method of removing an oxide film on a surface of a substrate, comprising the steps of:
   providing hydrogen radicals to the surface of the substrate;
   providing fluorine radicals to the surface of the substrate; and
   removing the oxide film by processing the surface of the substrate with the hydrogen radicals and the fluorine radicals, wherein
   the step of providing hydrogen radicals and the step of providing fluorine radicals are performed simultaneously, and the step of providing hydrogen radicals is terminated after the step of providing fluorine radicals is terminated.

2. The method as claimed in claim 1, wherein the hydrogen radicals are generated by exciting hydrogen gas with high frequency plasma.

3. The method as claimed in claim 2, wherein the hydrogen radicals are generated outside a processing space in which the substrate is retained, and are transported to the processing space.

4. The method as claimed in claim 1, wherein the fluorine radicals are generated by exciting fluorine gas with ultra violet rays.

5. The method as claimed in claim 4, wherein the fluorine radicals are generated in a processing space in which the substrate is retained.

6. The method as claimed in claim 1, wherein the step of providing the fluorine radicals is begun after the step of providing the hydrogen radicals is begun.

7. A method of removing an oxide film on a surface of a substrate, comprising the steps of:

providing hydrogen radicals to the surface of the substrate;
providing fluorine radicals to the surface of the substrate;
providing water vapor to the surface of the substrate; and
removing the oxide film by processing the surface of the substrate with the hydrogen radicals and the fluorine radicals,
wherein
the step of providing hydrogen radicals and the step of providing fluorine radicals are performed simultaneously; and the step of providing hydrogen radicals and fluorine radicals simultaneously and the step of providing water vapor are performed alternately and repeatedly.

8. The method as claimed in claim 7, wherein a processing space in which the substrate is retained is purged with inert gas after the step of providing water vapor and before the step of providing hydrogen radicals and fluorine radicals in parallel.

* * * * *